United States Patent
Lv et al.

(10) Patent No.: US 11,127,849 B2
(45) Date of Patent: Sep. 21, 2021

(54) ENHANCEMENT-MODE FIELD EFFECT TRANSISTOR

(71) Applicant: THE 13TH RESEARCH INSTITUTE OF CHINA ELECTRONICS TECHNOLOGY GROUP CORPORATION, Shijiazhuang (CN)

(72) Inventors: Yuanjie Lv, Shijiazhuang (CN); Yuangang Wang, Shijiazhuang (CN); Xubo Song, Shijiazhuang (CN); Xin Tan, Shijiazhuang (CN); Xingye Zhou, Shijiazhuang (CN); Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 16/759,518

(22) PCT Filed: Dec. 27, 2017

(86) PCT No.: PCT/CN2017/118837
§ 371 (c)(1),
(2) Date: Jun. 17, 2020

(87) PCT Pub. No.: WO2019/104807
PCT Pub. Date: Jun. 6, 2019

(65) Prior Publication Data
US 2020/0312992 A1    Oct. 1, 2020

(30) Foreign Application Priority Data

Nov. 29, 2017   (CN) .......................... 201711223203.7

(51) Int. Cl.
*H01L 29/78* (2006.01)
*H01L 29/10* (2006.01)

(52) U.S. Cl.
CPC .......... *H01L 29/78* (2013.01); *H01L 29/1033* (2013.01)

(58) Field of Classification Search
CPC .. H01L 29/78; H01L 29/1033; H01L 29/1075
See application file for complete search history.

(56) References Cited

U.S. PATENT DOCUMENTS

| | | | |
|---|---|---|---|
| 2014/0001557 A1* | 1/2014 | Mishra | H01L 29/2003 257/367 |
| 2014/0017856 A1 | 1/2014 | Fenouillet-Beranger et al. | |
| 2017/0256618 A1* | 9/2017 | Nelson | H01L 29/778 |

FOREIGN PATENT DOCUMENTS

| | | |
|---|---|---|
| CN | 102593159 A | 7/2012 |
| JP | H04299870 A | 10/1992 |
| JP | 2000269520 A | 9/2000 |

* cited by examiner

*Primary Examiner* — Changhyun Yi
(74) *Attorney, Agent, or Firm* — Slater Matsil, LLP

(57) ABSTRACT

The present disclosure discloses an enhancement-mode field effect transistor. This enhancement-mode field effect transistor includes a substrate, a channel layer formed on an upper surface of the substrate, a source electrode and a drain electrode respectively formed on both sides of the channel layer, and a gate electrode formed on an upper surface of the channel layer, a region outside the corresponding region of the gate electrode in the channel layer is provided with a carrier-free region. Carriers are absent in the carrier-free region, and carriers are present in the remaining portion of the channel layer. The carrier-free region is not disposed below the gate electrode, but is disposed outside the corresponding region of the gate electrode in the channel layer, and the threshold voltage of the device can be regulated by regulating the width and number of the carrier-free region.

18 Claims, 2 Drawing Sheets

ENHANCEMENT-MODE FIELD EFFECT TRANSISTOR

CROSS-REFERENCE TO RELATED APPLICATIONS

This application claims the benefit of International Application No. PCT/CN2017/118837, entitled "Enhancement-Mode Field Effect transistor" and filed on Dec. 27, 2017, which claims priority to Chinese Patent Application No. CN201711223203.7, filed on Nov. 29, 2017. The disclosures of the aforementioned applications are hereby incorporated herein by reference in their entireties.

TECHNICAL FIELD

The present disclosure relates to semiconductor devices, and in particular, to an enhancement-mode field effect transistor.

BACKGROUND

A field effect transistor (FET) is a voltage-controlled semiconductor device, and has advantages such as high input resistance, low noise, low power consumption, large dynamic range, easy integration, no secondary breakdown phenomenon and wide safety working area. According to the conductive mode, the FET is divided into an enhancement-mode FET and a depletion-mode FET.

Currently, a semiconductor-based enhancement-mode FET generally adopts an isoplanar channel layer, and realized by a method such as etching a groove below the gate electrode, ion implantation or disposing a capping layer, but such enhancement-mode FET has a large damage to the gate electrode interface, which will induce large interface density or defects.

SUMMARY OF THE INVENTION

These and other problems are generally solved or circumvented, and technical advantages are generally achieved, by embodiments of the present disclosure which provide an enhancement-mode field effect transistor.

The embodiment of this disclosure provides an enhancement-mode field effect transistor, aiming at solving the problem which the enhancement-mode FET has a large damage to the gate electrode interface in the prior art.

The enhancement-mode field effect transistor of the embodiment of this disclosure comprises a substrate, a channel layer formed on an upper surface of the substrate, a source electrode and a drain electrode respectively formed on an upper surface of the channel layer and located on opposite sides of the channel layer, a gate electrode formed on the upper surface of the channel layer and located between the source electrode and the drain electrode, wherein a region outside the corresponding region of the gate electrode in the channel layer is provided with a carrier-free region, carriers are absent in the carrier-free region, and carriers are present in the remaining portion of the channel layer.

Optionally, doping ions whose doping type is opposite to the doping type of the channel layer are injected into the channel layer where the carrier-free region is located, and neutralize the carriers in the channel layer where the carrier-free region is located, therefore the carrier-free region is formed.

Optionally, the carrier-free region is formed by etching a groove in the channel layer.

Optionally, a capping layer whose doping type is opposite to the doping type of the channel layer is provided on the upper surface of the channel layer where the carrier-free region is located, and the doping concentration of the capping layer is greater than the doping concentration of the channel layer, and the carriers in the capping layer neutralize the carriers in the channel layer where the carrier-free region is located, therefore the carrier-free region is formed.

Optionally, the number of the carrier-free regions is one or more.

Optionally, the number of the gate electrodes is one or more.

Optionally, a dielectric layer is provided between the gate electrode and the channel layer.

Optionally, a passivation layer is disposed outside the region of source electrode, the gate electrode and the drain electrode on the upper surface of the channel layer.

Optionally, the width of the carrier-free region is 1 nanometer to 10 micrometers.

Optionally, an intrinsic layer is provided between the substrate and the channel layer.

The present disclosure has various advantageous features. Compared with the prior art, the beneficial effects of the embodiment of this disclosure are as follows: according to the enhancement-mode field effect transistor provided by the embodiment of this disclosure, the carrier-free region is not disposed below the gate electrode, but is disposed outside the corresponding region of the gate electrode in the channel layer, when the carrier-free region is formed, no damage to the lower surface of the gate electrode occurs. Carriers always exist in the remaining portion of the carrier-free region in the channel layer, when the gate voltage is less than the threshold voltage of the device, no carriers exist in the carrier-free region, and the channel layer is not conductive; as the gate voltage increases positively, the conduction band of the carrier-free region decreases; when the gate voltage is greater than the threshold voltage, the conduction band decreases below the Fermi level, and the carrier-free region forms carriers, and the channel layer is conductive, and the device is turned on. According to the enhancement-mode FET provided by the embodiment of this disclosure, the threshold voltage of the devices can be regulated by regulating the width and number of the carrier-free region, and turning on the device or turning off the device only need to control the presence or absence of a small amount of carriers in the carrier-free region, and the device switching speed is fast.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to explain the technical solutions in the embodiments of this disclosure more clearly, below the accompanying drawings required in the description of the embodiments or the prior art are introduced briefly, obviously, the accompanying drawings in the following description are merely some embodiments of this disclosure, for those of ordinary skill in the art, other drawings can be obtained according to these accompanying drawings without creative efforts.

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In the following description, for purposes of illustration rather than limitation, specific details such as specific system structures and technologies are set forth, in order to thoroughly understand the embodiment of this disclosure. However, it should be apparent to those of skill in the art that the present solution may also be implemented in other embodiments without these specific details. In other cases, detailed descriptions of well-known systems, apparatuses, circuits and methods are omitted to avoid unnecessary detail hindering the description of this disclosure.

To illustrate the technical solutions of this disclosure, specific embodiments are described below.

Figure 1:
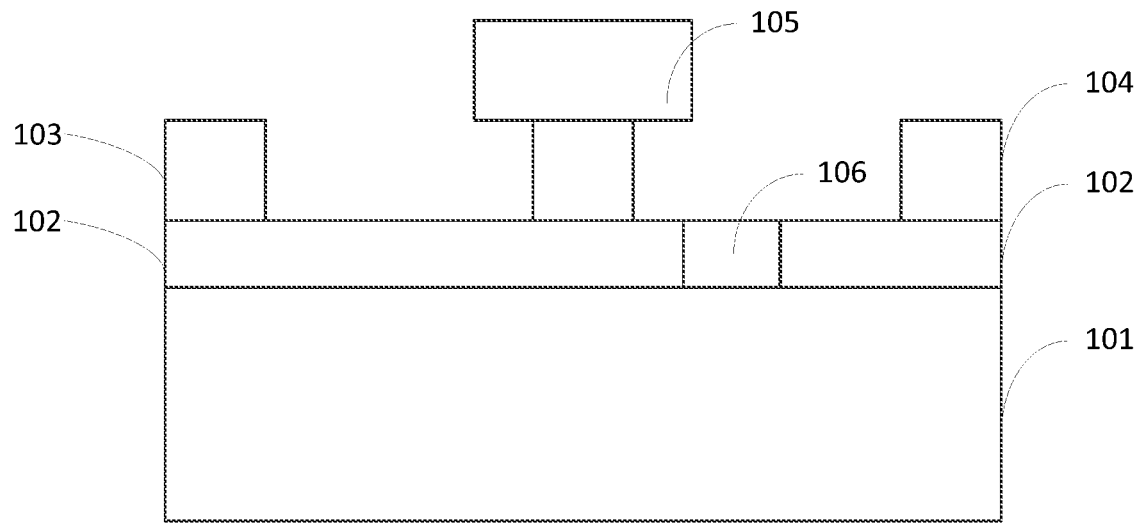
FIG. 1 is a structural schematic diagram of enhancement-mode field effect transistor provided by the embodiment of this disclosure.

Referring to FIG. 1, the enhancement-mode field effect transistor comprises a substrate 101, a channel layer 102 formed on an upper surface of the substrate 101, a source electrode 103 and a drain electrode 104 respectively formed on an upper surface of the channel layer 102 and located on opposite sides of the channel layer 102, and a gate electrode 105 formed on the upper surface of the channel layer 102 and located between the source electrode 103 and the drain electrode 104. A region outside the corresponding region of the gate electrode 105 in the channel layer 102 is provided with a carrier-free region 106. Carriers are absent in the carrier-free region 106, and carriers are present in the remaining portion of the channel layer 102.

According to the enhancement-mode FET provided by the embodiment of this disclosure, the carrier-free region 106 is not disposed below the gate electrode 105, but is disposed outside the corresponding region of the gate electrode 105 in the channel layer 102, when the carrier-free region 106 is formed, no damage to the lower surface of the gate electrode 105 occurs. Carriers are absent in the carrier-free region 106, and carriers are present in the remaining portion of the channel layer 102. When the gate voltage is less than the threshold voltage of the device, the channel layer 102 is not conductive; as the gate voltage increases positively, the conduction band of the carrier-free region 106 decreases; when the gate voltage is greater than the threshold voltage, the conduction band decreases below the Fermi level, and the carrier-free region 106 forms carriers, and the channel layer 102 is conductive, and the device is turned on. According to the enhancement-mode FET provided by the embodiment of this disclosure, the threshold voltage of the devices can be regulated by regulating the width and number of the carrier-free region 106, and turning on the device or turning off the device only need to control the presence or absence of a small amount of carriers in the carrier-free region 106, and the device switching speed is fast.

Optionally, doping ions whose doping type is opposite to the doping type of the channel layer 102 are injected into the channel layer 102 where the carrier-free region 106 is located, and neutralize the carriers in the channel layer 102 where the carrier-free region 106 is located, therefore the carrier-free region 106 is formed.

In the embodiment of this disclosure, the doping ions whose doping type is opposite to the doping type in the channel layer 102 are injected into the channel layer 102 where the carrier-free region 106 is located by an ion implantation method, for example, if the doping type of the channel layer 102 is n-type, the p-type doping ions are injected into the channel layer 102 where carrier-free region 106 is located. So the injected doping ions neutralize the carriers in the channel layer 102 where the carrier-free region 106 is located, therefore carriers are absent in the carrier-free region 106, and carriers are present in the remaining portion of the channel layer 102.

Figure 2:
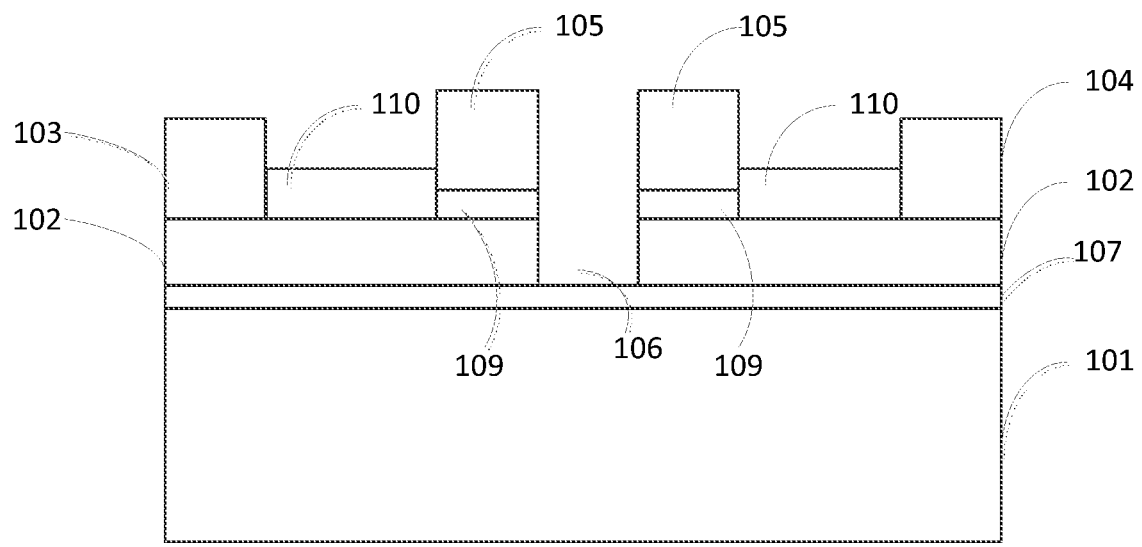
FIG. 2 is another structural schematic diagram of enhancement-mode field effect transistor provided by the embodiment of this disclosure.

As shown in FIG. 2, optionally, the carrier-free region 106 is formed by etching a groove in the channel layer 102.

In the embodiment of this disclosure, the carrier-free region 106 is formed by etching the groove in the channel layer 102 by a photolithography and etching process.

Optionally, an intrinsic layer 107 is provided between the substrate 101 and the channel layer 102. When the gate voltage is greater than the threshold voltage, carriers are formed in the intrinsic layer 107 corresponding to the region where carrier-free region 106 is located, so that the channel layer 102 is conductive.

Figure 3:
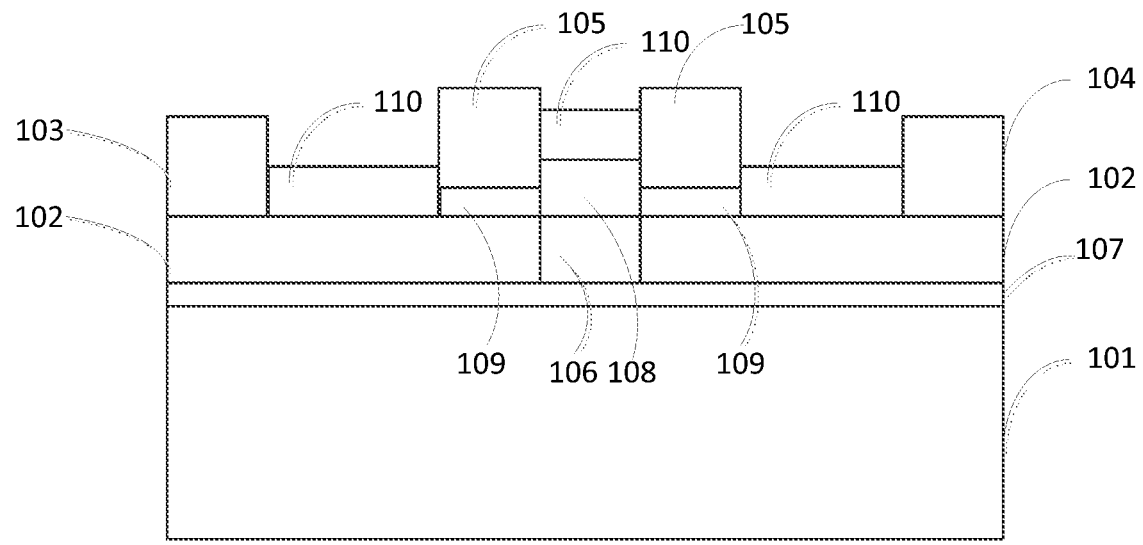
FIG. 3 is another structural schematic diagram of enhancement-mode field effect transistor provided by the embodiment of this disclosure.

As shown in FIG. 3, optionally, a capping layer 108 whose doping type is opposite to the doping type of the channel layer 102 is provided on the upper surface of the channel layer 102 where the carrier-free region 106 is located, and the doping concentration of the capping layer 108 is greater than the doping concentration of the channel layer 102, and the carriers in the capping layer 108 neutralize the carriers in the channel layer 102 where the carrier-free region 106 is located, therefore the carrier-free region 106 is formed.

In the embodiment of this disclosure, the capping layer 108 whose doping type is opposite to the doping type of the channel layer 102 is provided on the upper surface of the channel layer 102 where carrier-free region 106 is located, for example, if the doping type of the channel layer 102 is n-type, the doping type of the capping layer 108 is p-type, and the doping concentration of the capping layer 108 is greater than the doping concentration of the channel layer 102, so that electron holes in the capping layer 108 can completely neutralize the electrons in the channel layer 102 where carrier-free region 106 is located. So carriers are absent in the carrier-free region 106, and carriers are present in the remaining portion of the channel layer 102.

Optionally, the number of the carrier-free regions is one or more.

Figure 4:
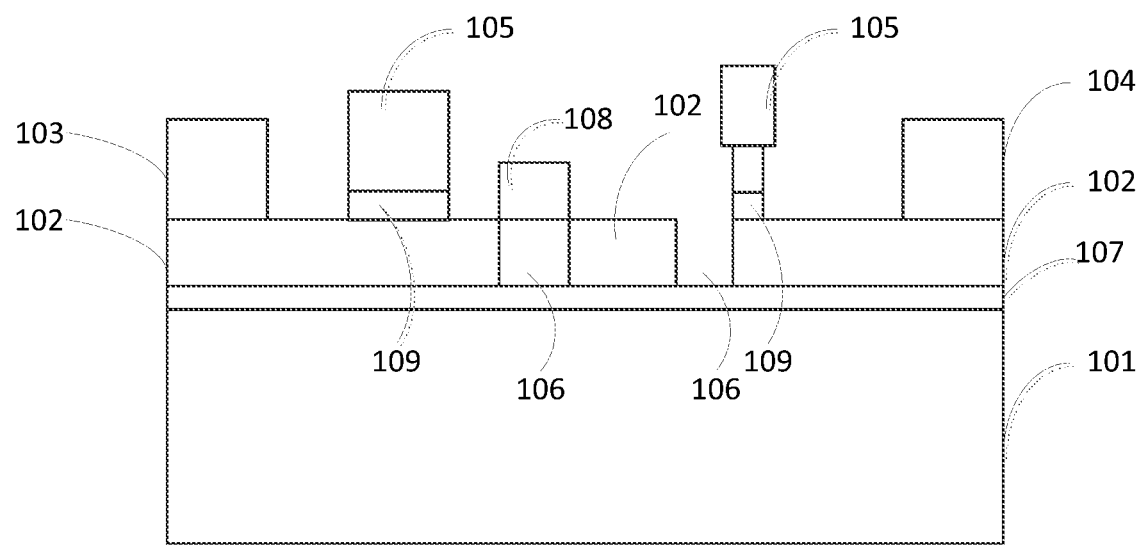
FIG. 4 is another schematic structural diagram of enhancement-mode field effect transistor provided by the embodiment of this disclosure.

In the embodiment of this disclosure, the number of the carrier-free regions can be one or more. When the number of the carrier-free regions is one, the carrier-free region 106 may be formed by using any one of the foregoing methods; when the number of the carrier-free regions is two or more, the carrier-free region 106 may be formed by using any one of the foregoing methods or a combination of multiple methods. For example, as shown in FIG. 4, two carrier-free regions 106 are provided in the channel layer 102, wherein one carrier-free region 106 is formed by etching a groove in the channel layer 102, and the other carrier-free region 106 is formed by providing a capping layer 108 whose doping type is opposite to the doping type of the channel layer 102 on the upper surface of the channel layer 102 where the carrier-free region 106 is located.

Optionally, a dielectric layer 109 is provided between the gate electrode 105 and the channel layer 102. The dielectric layer 109 includes, but is not limited to, an oxide layer, a nitride layer, or a composite layer of oxide and nitride.

Optionally, the upper surface of the channel layer 102 is provided with a passivation layer 110. The channel layer 102 is protected by the passivation layer 110.

Optionally, the number of the gate electrodes 105 is one or more.

In the embodiment of this disclosure, the number of the gate electrodes 105 may be one or more. The gate electrode 105 may adopt multiple of morphologies, including but not limited to a direct gate, a T-type gate, a Y-type gate, a TT-type gate, a V-type gate, and a U-type gate.

Optionally, the width of the carrier-free region 106 is 1 nanometer to 10 micrometers. Preferably, the width of the carrier-free region 106 is 50 nanometers to 800 micrometers. The threshold voltage of the device can be regulated by regulating the width and number of the carrier-free regions 106.

Optionally, the material of the channel layer 102 includes, but is not limited to, GaN, SiC, GaAs, Si, ZnO, graphene, diamond or $Ga_2O_3$. The material of the substrate 101 includes, but is not limited to, SiC, Si, diamond, sapphire and GaN, and the substrate 101 may also be a multilayer composite substrate.

It should be understood that, the sequence numbers of the steps in the foregoing embodiments do not mean an execution sequence. The execution sequence of each process should be determined by functions and internal logic of the process, and should not constitute any limitation to the implementation process of the embodiment of this disclosure.

The above-mentioned embodiments are only used to illustrate the technical solutions of this disclosure, rather than limitation; although the disclosure has been described in detail with reference to the foregoing embodiments, those of ordinary skill in the art will understand that: the technical solutions described in the foregoing embodiments may still be modified, or some technical features may be equivalently replaced; the essence of the corresponding technical solutions of such modifications or substitutions do not depart from the spirit and scope of technical solutions of embodiments of this disclosure, and they should be included in the scope of this disclosure.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. An enhancement-mode field effect transistor, comprising:
   a substrate;
   a channel layer formed on an upper surface of the substrate;
   a source electrode and a drain electrode respectively formed on an upper surface of the channel layer and located on opposite sides of the channel layer; and
   a gate electrode formed on the upper surface of the channel layer and located between the source electrode and the drain electrode, wherein:
   a region outside a corresponding region of the gate electrode in the channel layer is provided with a carrier-free region;
   carriers are absent in the carrier-free region; and
   the carriers are present in a remaining portion of the channel layer, and wherein the carrier-free region is not disposed below the gate electrode.

2. The enhancement-mode field effect transistor according to claim 1, wherein doping ions whose doping type is opposite to a doping type of the channel layer are injected into the channel layer where the carrier-free region is located, and neutralize the carriers in the channel layer where the carrier-free region is located, therefore the carrier-free region is formed.

3. The enhancement-mode field effect transistor of claim 2, wherein an intrinsic layer is provided between the substrate and the channel layer.

4. The enhancement-mode field effect transistor of claim 1, wherein the carrier-free region is formed by etching a groove in the channel layer.

5. The enhancement-mode field effect transistor of claim 4, wherein an intrinsic layer is provided between the substrate and the channel layer.

6. The enhancement-mode field effect transistor of claim 1, wherein a capping layer whose doping type is opposite to a doping type of the channel layer is provided on the upper surface of the channel layer where the carrier-free region is located, and a doping concentration of the capping layer is greater than a doping concentration of the channel layer, and carriers in the capping layer neutralize the carriers in the channel layer where the carrier-free region is located, therefore the carrier-free region is formed.

7. The enhancement-mode field effect transistor of claim 6, wherein an intrinsic layer is provided between the substrate and the channel layer.

8. The enhancement-mode field effect transistor according to claim 1, wherein the enhancement-mode field effect transistor comprises at least one carrier-free region.

9. The enhancement-mode field effect transistor of claim 8, wherein an intrinsic layer is provided between the substrate and the channel layer.

10. The enhancement-mode field effect transistor according to claim 1, wherein the enhancement-mode field effect transistor comprises at least one gate electrode.

11. The enhancement-mode field effect transistor of claim 10, wherein an intrinsic layer is provided between the substrate and the channel layer.

12. The enhancement-mode field effect transistor according to claim 1, wherein a dielectric layer is provided between the gate electrode and the channel layer.

13. The enhancement-mode field effect transistor of claim 12, wherein an intrinsic layer is provided between the substrate and the channel layer.

14. The enhancement-mode field effect transistor according to claim 1, wherein a passivation layer is disposed outside a region of the source electrode, the gate electrode and the drain electrode on the upper surface of the channel layer.

15. The enhancement-mode field effect transistor of claim 14, wherein an intrinsic layer is provided between the substrate and the channel layer.

16. The enhancement-mode field effect transistor of claim 1, wherein a width of the carrier-free region is in a range from 1 nanometer to 10 micrometers.

17. The enhancement-mode field effect transistor of claim 16, wherein an intrinsic layer is provided between the substrate and the channel layer.

18. The enhancement-mode field effect transistor of claim 1, wherein an intrinsic layer is provided between the substrate and the channel layer.

\* \* \* \* \*